United States Patent [19]

Padgaonkar

[11] Patent Number: 5,033,025

[45] Date of Patent: Jul. 16, 1991

[54] ON-CHIP REGISTER SETTING AND CLEARING

[76] Inventor: Ajay J. Padgaonkar, 9617 S. 43rd Pl., Phoenix, Ariz. 85044

[21] Appl. No.: 454,137

[22] Filed: Dec. 21, 1989

[51] Int. Cl.⁵ .......................................... G11C 13/00
[52] U.S. Cl. .......................... 365/189.05; 365/189.01
[58] Field of Search ..................... 365/189.01, 189.05, 365/230.01

[56] References Cited

U.S. PATENT DOCUMENTS 4,271,487  6/1981  Craycraft et al. .................... 365/78

Primary Examiner—Terrell W. Fears
Attorney, Agent, or Firm—Donald R. Greene

[57] ABSTRACT

A semiconductor integrated circuit device has an on-chip processor and at least one on-chip digital register for storing plural bits therein. The bit contents of the register are written, selectively transformed, and read out of the register during processing of data by the processor and related circuitry. Peripheral instructions such as those from an interrupt source may contend with instructions from the processor for setting and clearing one or more bits in the register. To permit setting and clearing a unique bit in the register without affecting other bits in the register or the capability of the contending source to perform its instructions on one or more of these other bits, three separate addresses are provided for bit set, bit clear, and direct write of the register.

6 Claims, 1 Drawing Sheet

ON-CHIP REGISTER SETTING AND CLEARING

BACKGROUND OF THE INVENTION

The present invention relates generally to semiconductor logic circuits, and more particularly to techniques for setting and clearing on chip registers.

Semiconductor processor devices typically include peripheral registers that are located on the integrated circuit chip and require selective setting and clearing of their stored contents. Most processors use instructions for bit set (in the binary sense, make the bit a "1") and bit clear (make the bit a "0"), or an OR "1" which is tantamount to a bit set, and an AND "0" which corresponds to a bit clear, or a combination of both, to set or clear the registers. The processor brings data from the affected location into the central processing unit (CPU), specifically the arithmetic logic unit (ALU), transforms it by setting or clearing the corresponding bit, and then sends it back. This is commonly referred to as a read/modify/write operation.

In most instances, this technique of executing a bit set and clear does not create a problem. However, in the case of peripheral or status registers there may be circumstances in which the CPU is setting or clearing at the same time that some other instruction, such as an interrupt, an opposite operation. In such circumstances there is a conflict, or a contention; for example, the CPU desires to clear a bit and the interrupting peripheral source desires to set the same or a closely positioned bit.

By way of a specific example, if the register contains four bits, namely, 0, 0, 1, 0, at the time the data is read into the ALU, the intention may be to clear the bit which is the "1" without affecting the other three bits in any way. If, however, while this process is taking place a peripheral source sets the first bit to a "1", so that the register contents after write should be 1, 0, 0, 0, the ALU will write the value of the register back as 0, 0, 0, 0. This is incorrect, since there should have been no effect on the bit that was just set by the peripheral source.

It is a principal object of the present invention to provide improvements in techniques for achieving bit set and bit clear of on-chip registers.

SUMMARY OF THE INVENTION

According to the present invention, separate addresses are provided for bit set, bit clear, and byte write/read to the same register. When a read/modify/write or a direct write of the register is intended, the conventional register write address is used. When a bit set or bit clear is desired, a specially added address is used, and a pattern is also specified to indicate which bit or bits are to be set or cleared. By using the separate bit set or bit clear address, as applicable, only the uniquely designated bit or bits is/are affected.

Implementation of this technique in the register is achieved by adding, in a preferred embodiment, a pull up string and pull down string of transistors.

Therefore, it is another object of the invention to provide a method by which an on-chip register is addressed to perform setting and clearing of one or more bits thereof as well as to allow reliable writing to the register.

Yet another object is to provide improvements in implementation of on-chip registers for bit set, bit clear, and register write operations.

BRIEF DESCRIPTION OF THE DRAWINGS

The above and still further objects, features and attendant advantages of the invention will become clear from a consideration of the following detailed description of a presently preferred embodiment thereof, taken in conjunction-with-the accompanying drawing, in which.

DETAILED DESCRIPTION OF THE PREFERRED EMBODIMENT

Figure 1:
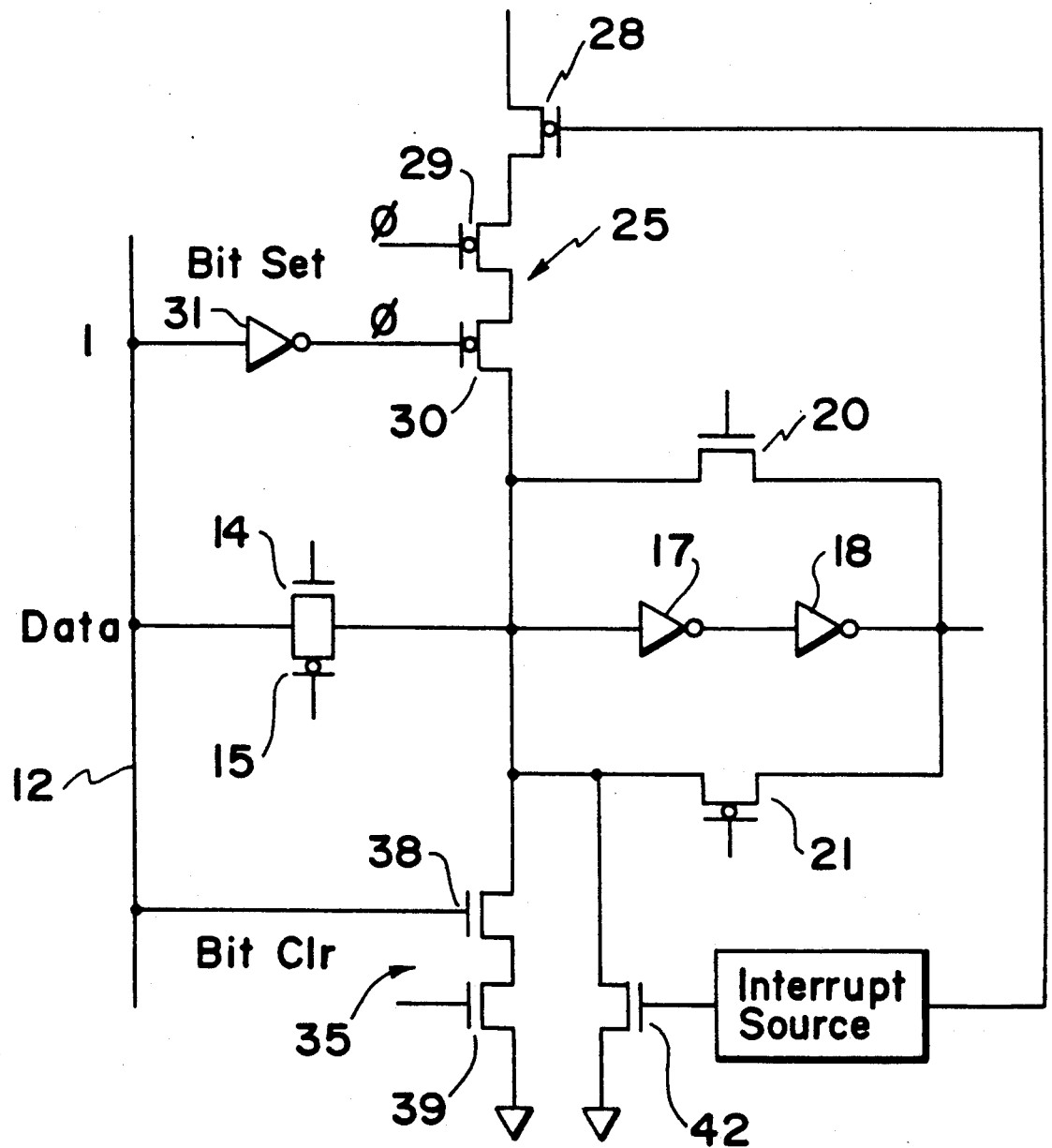
FIG. 1, the sole figure of the drawing, is a simplified schematic diagram illustrating the modification of a conventional on-chip register according to the preferred embodiment of the invention.

Referring now to the drawing, a portion of a conventional on-chip peripheral register includes a direct write input from a data bus 12 which is connected to the parallel source-drain paths of a pair of MOS transistors, transistor 14 of which is an N-channel type and transistor 15 a P-channel type. The source-drain paths of those two transistors are also connected to the series connection of a pair of inverters 17 and 18, the pair being connected in parallel with the source-drain paths of another pair of MOS transistors 20 and 21. Transistor 20 is NMOS and transistor 21 is PMOS. In a conventional read/modify/write or direct write operation, the desired bit is written into the register by selectively addressing the register via the gates of transistors 14 and 15.

According to the preferred embodiment of the invention, a pull up string 25 and a pull down string 35 are added to the conventional register structure. The pull up string includes three P-type MOS transistors 28, 29, and 30 having their source-drain paths connected in series in a stack, for pulling up the input of the register, and an inverter 31 connected between the data bus and the gate of transistor 30. The bit set address for the unique bit of interest is decoded and sent to the gate of transistor 29 of the pull up string. If the register is being set to a "1", the bit set value would be "0" and the data bus corresponding to that bit would be "1". In these circumstances, transistors 29 and 30 each have a "0" at their respective gates (transistor 30 via inverter 31 from the data bus), and the input of the register is pulled up to a "1" provided that the interrupt source connected to the gate of transistor 28 is not active (i.e., is not "1"). Any other bits in the register are unaffected by this operation of the pull up string.

A complementary operation occurs in the case of a "bit clear". The pull down string 35 includes N-type transistors 38 and 39. In the example described above for the pull up string operation, the complementary pull down string is not activated and the bit is unaffected.

If an interrupt source 40 were attempting to pull the register input down to clear the bit it could do so without loss of information.

The invention requires the use of three separate register addresses (for bit set, bit clear, and byte write/read) for each register needing the capability to perform a bit set or bit clear function for some bits while leaving all other bits unaffected. It should be emphasized however, that not all of the registers on the chip need such capability, and for them, a read/modify/write configuration will suffice.

Although a preferred embodiment of the invention has been described, it will be recognized by persons skilled in the field to which the invention pertains that variations and modifications ma be made without departing from the true spirit and scope of the invention. It is therefore intended that the invention shall be limited only to the extent required by the appended claims and the applicable rules and principles of law.

What is claimed is:

1. In a semiconductor integrated circuit chip having an on-chip processor and at least one register for storing digital bits therein, said at least one register having a register write address for rewriting bits stored therein, and wherein said processor is adapted to set and clear individual bits in said at least one register, by selectively addressing said register write address, according to the data to be processed by said processor, the improvement comprising address means electrically connected to said at least one register for providing bit set and bit clear addresses for each of the bit locations in said at least one register separate from said register write address for said at least one register, said address means including means for setting and clearing individual bits in said at least one register when addressed by said address means, without disturbing the other bits therein.

2. The improvement of claim 1 wherein
said address means further includes pull up and pull down strings of transistors electrically connected to an input of said at least one register.

3. A semiconductor device including a chip having a register in which plural bits may be written in a bit sequence, transformed, and read out, said device comprising byte address means for said register for performing a read/modify/write operation on said register to modify the overall data represented by the bit sequence in said register, and alternate means for separately addressing individual bits in said register for setting and clearing thereof independently of the others of said plural bits in the bit sequence.

4. The invention according to claim 3 wherein
said alternate means includes first transistor means for decoding a bit set address in said register and second transistor means for decoding a bit clear address in said register.

5. The invention according to claim 4 wherein
said alternate means further includes
means operatively associated with said first transistor means for setting a bit addressed by said first transistor means, and
means operatively associated with said second transistor means for clearing a bit addressed by said second transistor means.

6. A method for setting and clearing bits in a register on a semiconductor chip by instructions from a related processor, while avoiding errors arising from contention between setting and clearing instructions from the processor and clearing and setting instructions from a peripheral source, which includes the steps of
addressing the bit to be set or cleared in the register with a bit address separate from the read/write address of the register, to uniquely identify the bit to be set or cleared, and
thereafter performing a bit set or a bit clear, as desired, on the uniquely identified bit.

* * * * *